(12) United States Patent
Liou et al.

(10) Patent No.: US 8,987,830 B2
(45) Date of Patent: Mar. 24, 2015

(54) ATTACHING PASSIVE COMPONENTS TO A SEMICONDUCTOR PACKAGE

(75) Inventors: Shiann-Ming Liou, Campbell, CA (US); Albert Wu, Palo Alto, CA (US)

(73) Assignee: Marvell World Trade Ltd., St. Michael (BB)

( * ) Notice: Subject to any disclaimer, the term of this patent is extended or adjusted under 35 U.S.C. 154(b) by 97 days.

(21) Appl. No.: 12/943,673

(22) Filed: Nov. 10, 2010

(65) Prior Publication Data

US 2011/0169163 A1 Jul. 14, 2011

Related U.S. Application Data

(60) Provisional application No. 61/294,425, filed on Jan. 12, 2010.

(51) Int. Cl.
*H01L 27/11* (2006.01)
*H01L 23/50* (2006.01)
*H01L 23/31* (2006.01)
*H01L 23/00* (2006.01)

(52) U.S. Cl.
CPC .......... *H01L 23/50* (2013.01); *H01L 23/3121* (2013.01); *H01L 23/3128* (2013.01); *H01L 24/73* (2013.01); *H01L 2224/48091* (2013.01); *H01L 2224/48227* (2013.01); *H01L 2224/73265* (2013.01); *H01L 2924/01033* (2013.01); *H01L 2924/01077* (2013.01); *H01L 2924/01082* (2013.01); *H01L 24/48* (2013.01); *H01L 2924/01005* (2013.01); *H01L 2924/01006* (2013.01); *H01L 2924/01019* (2013.01); *H01L 2924/014* (2013.01); *H01L 2224/16145* (2013.01); *H01L 2224/32225* (2013.01); *H01L 2924/15311* (2013.01)

USPC .......................................... 257/379; 257/738

(58) Field of Classification Search
USPC .......... 257/379, 738, E27.026; 438/382, 393, 438/455, 82, 381
See application file for complete search history.

(56) References Cited

U.S. PATENT DOCUMENTS

| 6,861,288 | B2 * | 3/2005 | Shim et al. ..................... 438/109 |
| 7,030,469 | B2 * | 4/2006 | Mahadevan et al. .......... 257/659 |
| 7,566,966 | B2 | 7/2009 | Chow et al. |
| 7,602,053 | B2 * | 10/2009 | Huang et al. .................. 257/676 |
| 7,923,825 | B2 * | 4/2011 | Bayan et al. .................. 257/672 |
| 8,187,920 | B2 * | 5/2012 | Mohan et al. ................. 438/106 |
| 2005/0127495 | A1 * | 6/2005 | Zhang et al. .................. 257/700 |
| 2006/0099775 | A1 | 5/2006 | Daubenspeck et al. |
| 2006/0270098 | A1 * | 11/2006 | Clevenger et al. .............. 438/82 |

(Continued)

FOREIGN PATENT DOCUMENTS

| CN | 1383206 A | 12/2002 |
| CN | 1856878 | 11/2006 |
| CN | 1956193 A | 5/2007 |

(Continued)

*Primary Examiner* — Zandra Smith
*Assistant Examiner* — John M Parker

(57) ABSTRACT

Embodiments of the present disclosure provide a method comprising forming an electrically conductive structure on a surface of a semiconductor die, attaching the semiconductor die to a substrate, forming a molding compound to encapsulate the semiconductor die, forming an opening in the molding compound, the opening to at least partially expose the electrically conductive structure, and electrically coupling a passive component to the electrically conductive structure through the opening in the molding compound. Other embodiments may be described and/or claimed.

12 Claims, 6 Drawing Sheets

(56) References Cited

U.S. PATENT DOCUMENTS

| | | |
|---|---|---|
| 2008/0017907 A1 | 1/2008 | Otremba |
| 2008/0047740 A1 | 2/2008 | Lien et al. |
| 2008/0136003 A1 | 6/2008 | Pendse |
| 2008/0308917 A1 | 12/2008 | Pressel et al. |
| 2009/0152692 A1* | 6/2009 | Chow et al. .................. 257/668 |

FOREIGN PATENT DOCUMENTS

| | | |
|---|---|---|
| CN | 101097899 A | 1/2008 |
| TW | 200415775 | 8/2004 |
| TW | 200620598 | 6/2006 |
| TW | 200629434 | 8/2006 |
| TW | 200729420 | 8/2007 |

* cited by examiner

ATTACHING PASSIVE COMPONENTS TO A SEMICONDUCTOR PACKAGE

CROSS REFERENCE TO RELATED APPLICATION

This disclosure claims priority to U.S. Provisional Patent Application No. 61/294,425, filed Jan. 12, 2010, the entire specification of which is hereby incorporated by reference in its entirety for all purposes, except for those sections, if any, that are inconsistent with this specification.

TECHNICAL FIELD

Embodiments of the present disclosure relate to the field of integrated circuits, and more particularly, to techniques, structures, and configurations for attaching a passive component to a semiconductor package.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Integrated circuit devices, such as transistors, are formed on semiconductor dies that continue to scale in size to smaller dimensions. The shrinking dimensions of the semiconductor dies generally result in faster switching frequencies and/or increased power consumption, which may cause large switching currents to flow in power/ground interconnects for the semiconductor dies. Noise and/or resistance associated with the power/ground interconnects may result in a voltage drop, commonly referred to as IR-drop, for the semiconductor dies. Excessive voltage drops may degrade performance and/or reliability of the semiconductor dies.

Currently, a capacitor may be directly attached to a surface of the semiconductor die to supply additional current to mitigate the voltage drops described above. However, directly affixing the capacitor to the semiconductor die may cause cracks in the semiconductor die due to differences in thermal expansion of materials used for the capacitor and the semiconductor die. Such cracks or similar failures may be exacerbated by a brittle nature of materials used to fabricate some current semiconductor dies.

SUMMARY

In one embodiment, the present disclosure provides a method comprising forming an electrically conductive structure on a surface of a semiconductor die, attaching the semiconductor die to a substrate, forming a molding compound to encapsulate the semiconductor die, forming an opening in the molding compound, the opening to at least partially expose the electrically conductive structure, and electrically coupling a passive component to the electrically conductive structure through the opening in the molding compound.

In another embodiment, the present disclosure provides a semiconductor package comprising a substrate, a semiconductor die coupled to the substrate, the semiconductor die having an electrically conductive structure formed on a surface of the semiconductor substrate, a molding compound disposed to substantially encapsulate the semiconductor die, the molding compound having an opening formed in the molding compound, and a passive component disposed on the molding compound, the passive component being electrically coupled to the electrically conductive structure through the opening in the molding compound.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

Embodiments of the present disclosure describe techniques, structures, and configurations for attaching a passive component to a semiconductor package. In the following detailed description, reference is made to the accompanying drawings which form a part hereof, wherein like numerals designate like parts throughout. Other embodiments may be utilized and structural or logical changes may be made without departing from the scope of the present disclosure. Therefore, the following detailed description is not to be taken in a limiting sense, and the scope of embodiments is defined by the appended claims and their equivalents.

The description may use perspective-based descriptions such as up/down and top/bottom. Such descriptions are merely used to facilitate the discussion and are not intended to restrict the application of embodiments described herein to any particular orientation.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

Various operations are described as multiple discrete operations, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

Figure 1A:
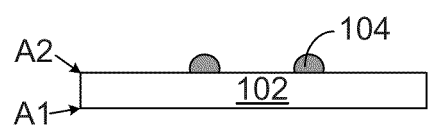
FIGS. 1A-1D schematically illustrate a semiconductor package subsequent to various process operations including attachment of a passive component.

FIGS. 1A-1E schematically illustrate a semiconductor package subsequent to various process operations including attachment of a passive component 122. Referring to FIG. 1A, a semiconductor die 102 is depicted subsequent to forming one or more bumps 104 on the semiconductor die 102. The semiconductor die 102 includes a first surface, A1, and a second surface, A2, that is opposite to the first surface A1. In an embodiment, the second surface A2 is an active surface of the semiconductor die 102 upon which a plurality of integrated circuit (IC) devices (not shown) such as transistors for logic and/or memory are formed. The first surface A1 may be referred to as an inactive surface to indicate that it is not the active surface. The active surface of the semiconductor die 102 may include a low-k dielectric, which may be a material having a smaller dielectric constant relative to silicon dioxide ($SiO_2$). According to various embodiments, the one or more bumps 104 are formed on the active surface of the semiconductor die 102. The one or more bumps 104 can be formed on the semiconductor die 102 while the semiconductor die 102 is in either wafer or singulated form.

The one or more bumps 104 are structures that comprise an electrically conductive material such as metal, solder, or alloy and can include a variety of shapes and configurations. For example, the one or more bumps 104 can be spherical or semi-spherical, as depicted, or include other shapes such as polygons, cylinders, or the like. The one or more bumps 104 can be formed using a bumping process, such as, for example, a controlled collapse chip connect (C4) process, stud-bumping, or other suitable bumping process. The one or more bumps 104 provide an electrical connection or part of an electrical connection between the semiconductor die 102 and a passive component (e.g., passive component 122 of FIG. 1E) to be coupled to the semiconductor die 102. In some embodiments, the one or more bumps 104 provide power and/or ground connections for the semiconductor die 102.

Figure 1B:
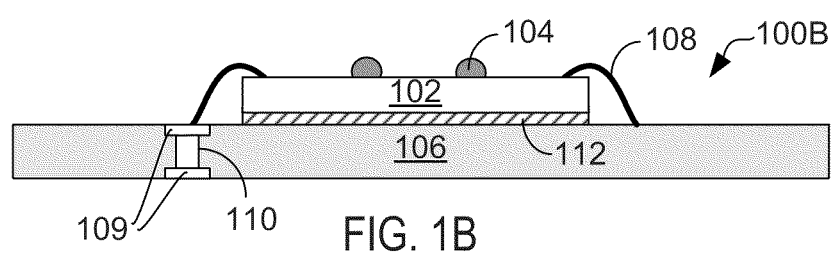

Referring to FIG. 1B, a semiconductor package 100B is depicted subsequent to attaching the semiconductor die 102 to a substrate 106. In other embodiments, the semiconductor die 102 can be coupled to other types of chip carriers such as, for example, a leadframe having one or more bond fingers. In an embodiment, the first surface (e.g., the first surface A1 of FIG. 1A) of the semiconductor die 102 is physically coupled to the substrate 106 using an adhesive 112, such as, for example, an epoxy. The second surface (e.g., the second surface A2 of FIG. 1A) of the semiconductor die 102 is electrically coupled to the substrate 106 using one or more bonding wires 108, as shown. The one or more bonding wires 108 generally comprise an electrically conductive material, such as a metal, to route electrical signals such as, for example, input/output (I/O) or power/ground signals to or from the semiconductor die 102. The one or more bonding wires 108 can be formed using, for example, a ball-bonding or wedge-bonding process.

The substrate 106 generally includes one or more electrically conductive structures, such as, for example, traces 109 formed on opposing surfaces of the substrate, and/or one or more via 110 to electrically couple the opposing surfaces. The one or more electrically conductive structures of the substrate 106 are configured to route the electrical signals to or from the semiconductor die 102. For example, the one or more bonding wires 108 may be coupled to the electrically conductive structures on the substrate 106, as shown. According to various embodiments, the substrate 106 can include laminate, ceramic, or semiconductor types of substrate. Although a wirebonding configuration is depicted for the semiconductor package 100B of FIG. 1B, other package configurations that benefit from the principles described herein can be used in other embodiments.

Figure 1C:
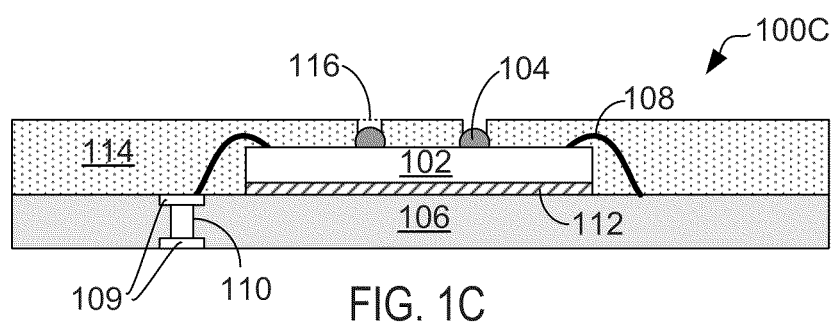

Referring to FIG. 1C, a semiconductor package 100C is depicted subsequent to forming a molding compound 114 to encapsulate the semiconductor die 102 and subsequent to forming one or more openings 116 in the molding compound 114. The molding compound 114 is an electrically insulative material that protects components of the semiconductor package 100C from moisture, oxidation, dust, or other materials or contact that could potentially damage the semiconductor die 102, the substrate 106, and associated features. The molding compound 114 can be formed according to any suitable molding compound technique, including, for example, depositing a resin in powder form into a mold and applying heat to melt/fuse the resin. Other suitable techniques can be used in other embodiments.

The one or more openings 116 are formed to correspond with and to at least partially expose the one or more bumps 104, as shown. Although two bumps 104 and two openings 116 are depicted in FIG. 1C, more or less bumps or openings can be used in other embodiments. The one or more openings 116 can be formed using, for example, an etch or laser process to remove portions of the molding compound 114. According to various embodiments, the one or more bumps 104 provide an etch stop or laser-drilling stop material. That is, the etching process and/or the laser drilling process may readily remove material of the molding compound 114, but may not readily remove material of the one or more bumps 104.

Figure 1D:
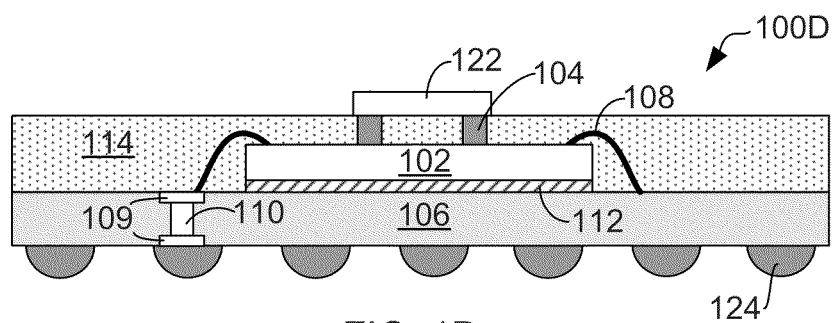

Referring to FIG. 1D, a semiconductor package 100D is depicted subsequent to electrically coupling a passive component 122 to the one or more bumps 104 through the one or more openings (e.g., the one or more openings 116 of FIG. 1C). In some embodiments, the passive component 122 is positioned onto or adjacent to the one or more bumps 104 and the one or more bumps are heated to form a direct joint (e.g., electrical connection) between the passive component 122 and the one or more bumps 104. Thus, the passive component 122 is electrically coupled to the semiconductor die 102.

Attaching the passive component 122 such that the passive component 122 is disposed on and external to the molding compound 114 over the one or more openings, as shown, may reduce stress on the semiconductor die 102 from the passive component 122. Thus, the semiconductor package 100D having a passive component 122 configured as shown may reduce cracking or other similar failures associated with directly coupling the passive component 122 onto the semiconductor die 102 (e.g., coupling the passive component 122 to the semiconductor die 102 prior to forming the molding compound 114). The configuration of the passive component 122 relative to the semiconductor package 100D, as shown, may particularly provide stress relief to a semiconductor die that uses a material that is relatively more brittle than silicon dioxide, such as a low-k dielectric material, on the active surface.

According to various embodiments, the passive component 122 comprises a capacitor (e.g., a bypass capacitor) to supply additional current to the semiconductor die 102 and to mitigate for noise and/or IR drop effects of the semiconductor die 102. The passive component 122 can include other passive components such as, for example, resistors, inductors, or transformers, that benefit from the principles described herein in other embodiments.

One or more solder balls 124 may be attached to the substrate 106 to provide an electrical connection between the semiconductor package 100D and an electronic device such as, for example, a motherboard or other circuit board, that is external to the semiconductor package 100D. The one or more solder balls 124 can be used to route the electrical signals, such as the I/O and/or power/ground signals for the semiconductor die 102, to or from the semiconductor package 100D.

Figure 2A:
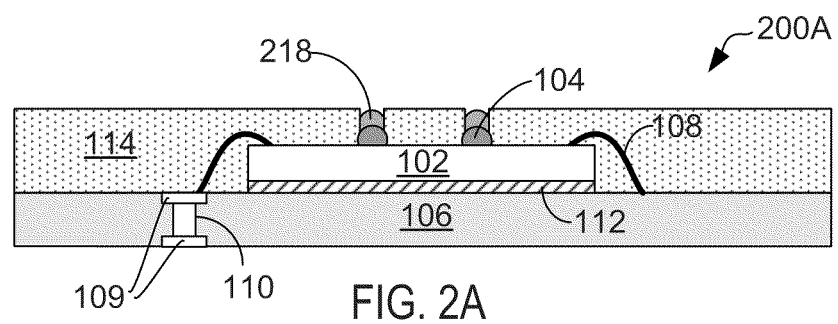
FIGS. 2A-2B schematically illustrate another semiconductor package subsequent to various process operations including attachment of a passive component.
Figure 2B:
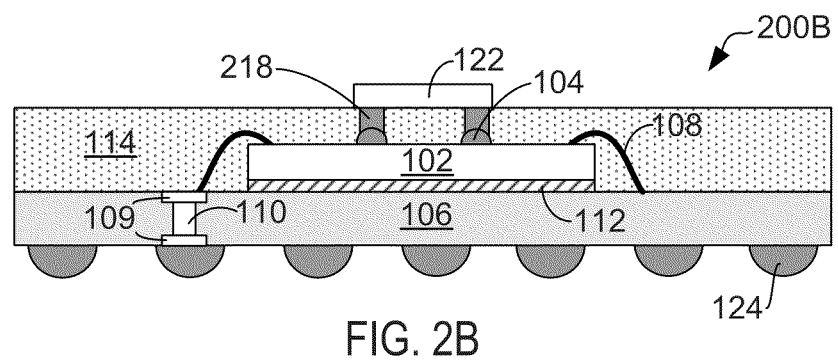

FIGS. 2A-2B schematically illustrate another semiconductor package subsequent to various process operations including attachment of a passive component 122. FIGS. 2A-2B include features such as semiconductor die 102, one or more bumps 104, substrate 106, one or more bonding wires 108, traces 109, one or more vias 110, adhesive 112, molding compound 114, passive component 122, and one or more solder balls 124, which may comport with embodiments already described in connection with FIGS. 1A-1E.

Referring to FIG. 2A, a semiconductor package 200A is depicted subsequent to depositing a solderable material 218 onto one or more bumps 104, as shown. In some embodiments, the semiconductor package 200A depicts the semiconductor package 100C of FIG. 1C subsequent to depositing the solderable material 218 onto the one or more bumps 104. The solderable material 218 is disposed within the one or more openings (e.g., the one or more openings 116 of FIG. 1C). According to various embodiments, the solderable material 218 can include any of a variety of metals, alloys, or solder pastes that fuse when heated, including, for example lead or lead-free solders.

Referring to FIG. 2B, a semiconductor package 200B is depicted subsequent to electrically coupling a passive component 122 to the one or more bumps 104 using the solderable material 218. In an embodiment, the passive component 122 is positioned onto or adjacent to the solderable material 118 and the solderable material 118 is heated to form a joint (e.g., electrical connection) between the passive component 122 and the one or more bumps 104.

Figure 3A:
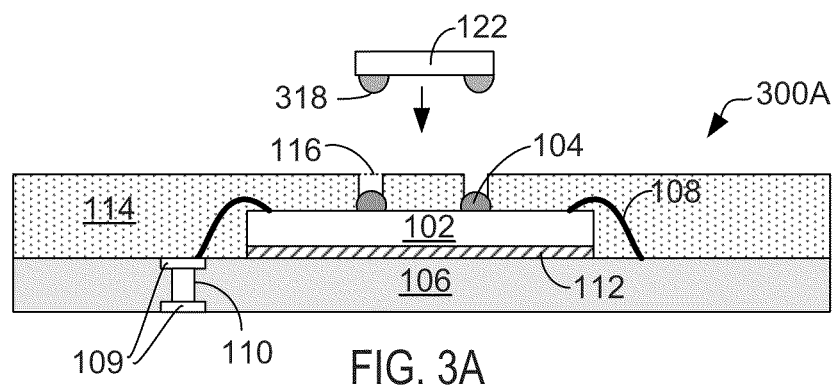
FIGS. 3A-3B schematically illustrate yet another semiconductor package subsequent to various process operations including attachment of a passive component.
Figure 3B:
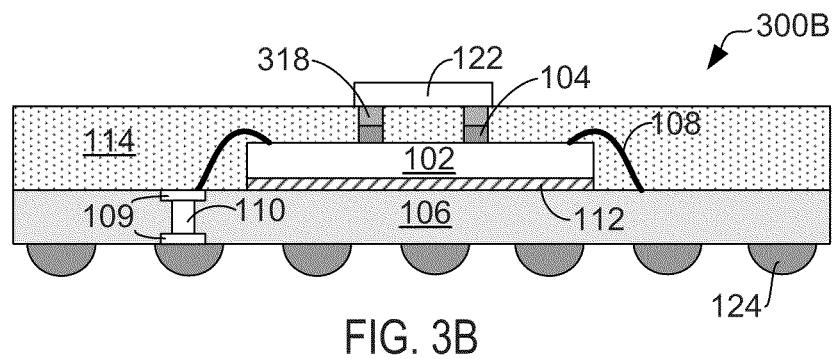

FIGS. 3A-3B schematically illustrate yet another semiconductor package subsequent to various process operations including attachment of a passive component 122. FIGS. 3A-3B include features such as semiconductor die 102, one or more bumps 104, substrate 106, one or more bonding wires 108, traces 109, one or more vias 110, adhesive 112, molding compound 114, one or more openings 116, passive component 122, and one or more solder balls 124, which may comport with embodiments already described in connection with FIGS. 1A-1E.

Referring to FIG. 3A, a semiconductor package 300A is depicted subsequent to depositing solderable material 318 onto the passive component 122. The solderable material 318 may be disposed to substantially align with the one or more openings 116 when the passive component 122 is positioned to overlay the semiconductor package 300A, as shown. According to various embodiments, the solderable material 318 can include any of a variety of metals, alloys, or solder pastes that fuse when heated, including, for example lead or lead-free solders.

Referring to FIG. 3B, a semiconductor package 300B is depicted subsequent to electrically coupling the passive component 122 to the one or more bumps 104 using the solderable material 318 disposed on the passive component 122. In an embodiment, the solderable material 318 disposed on the passive component 122 is positioned onto or adjacent to the one or more bumps 104 in the one or more openings (e.g., the one or more openings 116 of FIG. 3A) and the solderable material 318 is heated to form a joint (e.g., electrical connection) between the passive component 122 and the one or more bumps 104.

FIGS. 4A-4E schematically illustrate still yet another semiconductor package subsequent to various process operations including attachment of a passive component 122. FIGS. 4A-4E include features such as semiconductor die 102, substrate 106, one or more bonding wires 108, traces 109, one or more vias 110, adhesive 112, molding compound 114, one or more openings 116, passive component 122, and one or more solder balls 124, which may comport with embodiments already described in connection with FIGS. 1A-1E.

Figure 4A:
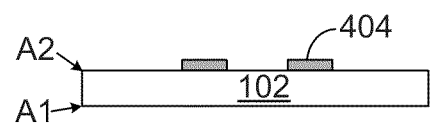
FIGS. 4A-4E schematically illustrate still yet another semiconductor package subsequent to various process operations including attachment of a passive component.

Referring to FIG. 4A, a semiconductor die 102 is depicted subsequent to forming one or more lands 404 on the semiconductor die 102. According to various embodiments, the one or more lands 404 are formed on the active surface of the semiconductor die 102. The one or more lands 104 can be formed on the semiconductor die 102 while the semiconductor die 102 is in either wafer or singulated form.

Figure 4B:
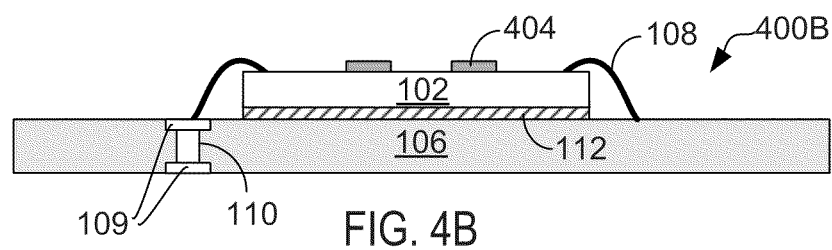
Figure 4C:
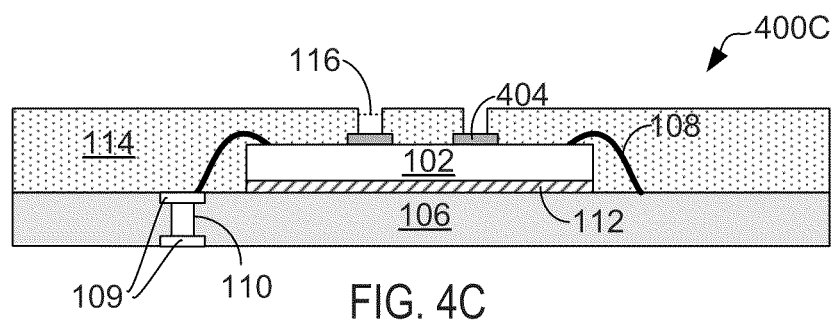
Figure 4D:
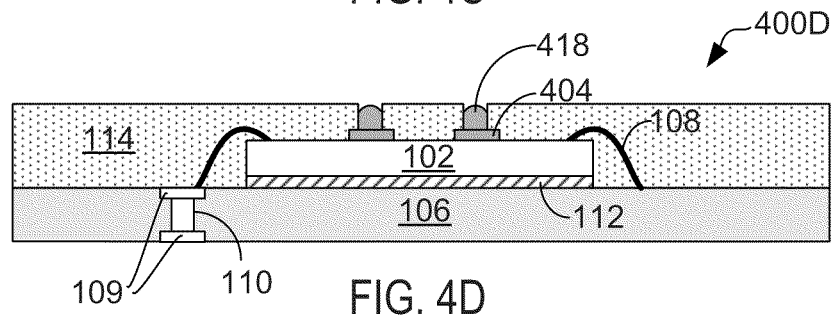
Figure 4E:
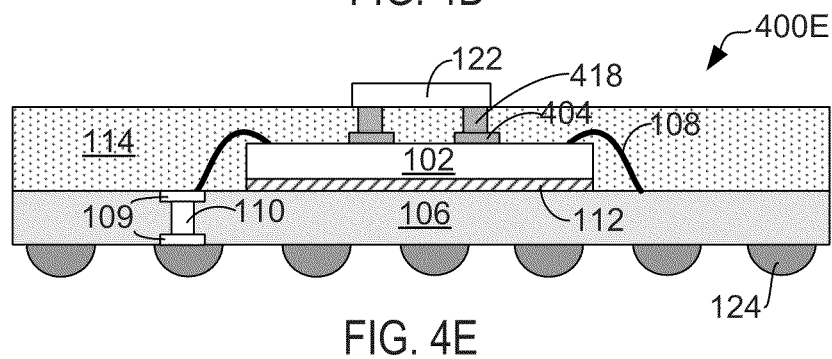

The one or more lands 404 are structures that comprise an electrically conductive material such as metal and generally include a substantially flat pad-like surface to receive one or more electrical connections of another device (e.g., passive component 122 of FIG. 4E). The one or more lands 404 can be formed, for example, using semiconductor manufacturing processes such as metal deposition and/or patterning (e.g., etch and/or lithography). The one or more lands 404 provide part of an electrical connection between the semiconductor die 102 and a passive component (e.g., the passive component 122 of FIG. 4E) to be coupled to the semiconductor die 102. In some embodiments, the one or more lands 404 provide power and/or ground connections for the semiconductor die 102.

Referring to FIG. 4B, a semiconductor package 100B is depicted subsequent to attaching the semiconductor die 102 to the substrate 106. Although, in the depicted embodiment, the semiconductor die 102 is attached to the substrate in a wirebonding configuration, other suitable configurations that benefit from the principles described herein can be used in other embodiments.

Referring to FIG. 4C, a semiconductor package 400C is depicted subsequent to forming molding compound 114 to encapsulate the semiconductor die 102 and subsequent to forming one or more openings 116 in the molding compound 114. The features depicted in FIGS. 4B-4C may comport with embodiments already described in connection with FIGS. 1B-1C, except that the respective semiconductor packages 400C and 400D of FIG. 4B and FIG. 4C include the one or more lands 404 instead of the one or more bumps 104.

Referring to FIG. 4D, a semiconductor package 400D is depicted subsequent to depositing a solderable material 418 onto the one or more lands 404, as shown. The solderable material 418 is disposed within the one or more openings (e.g., the one or more openings 116 of FIG. 4C). According to various embodiments, the solderable material 418 can include any of a variety of metals, alloys, or solder pastes that fuse when heated, including, for example lead or lead-free solders.

Referring to FIG. 4E, a semiconductor package 400E is depicted subsequent to electrically coupling the passive component 122 to the one or more lands 404 using the solderable material 418. In an embodiment, the passive component 122 is positioned onto or adjacent to the solderable material 418 and the solderable material 418 is heated to form a joint (e.g., electrical connection) between the passive component 122 and the one or more lands 404.

Techniques and configurations described in connection with FIGS. 1A-1E, 2A-2B, and 3A-3C, and 4A-4E may be suitably combined in some embodiments. For example, in some embodiments, the passive component 122 of FIGS. 4A-4E can include a solderable material (e.g., solderable material 318 of FIG. 3A) that is disposed on the passive component 122 as described in connection with FIG. 3A. In such a case, the solderable material 418 of FIG. 4D may or may not be used, according to various embodiments. Other suitable combinations of techniques and configurations that comport with the principles described herein can be used in other embodiments.

Figure 5:
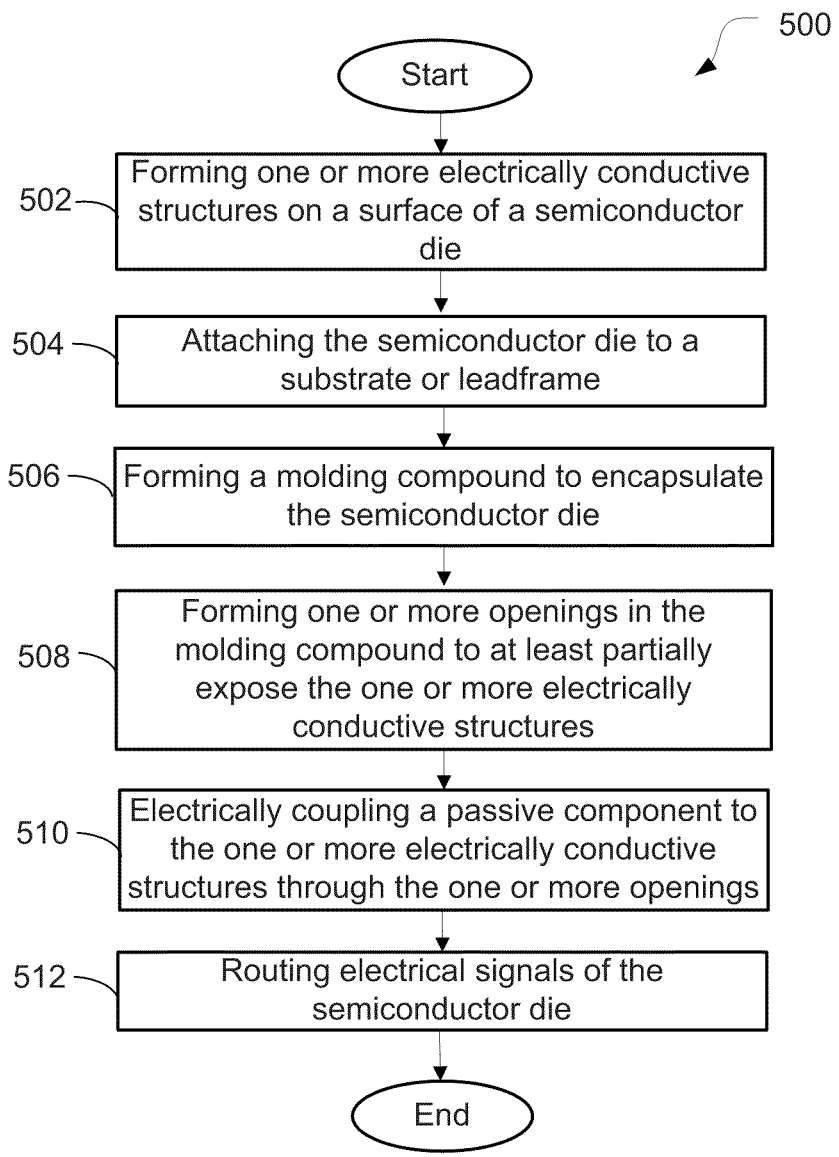
FIG. 5 is a process flow diagram of a method to fabricate a semiconductor package and attach a passive component.

FIG. 5 is a process flow diagram of a method 500 to fabricate a semiconductor package (e.g., the semiconductor packages 100B, 100C, 100D, 200A, 200B, 300A, 300B, 400B, 400C, 400D, and 400E of respective FIGS. 1B, 1C, 1D, 2A, 2B, 3A, 3B, 4B, 4C, 4D, and 4E) and attach a passive component (e.g., the passive component 122 of FIGS. 1D, 2B, 3A, 3B, and 4E). The techniques and configurations described in connection with method 500 may comport with techniques and configurations described in connection with FIGS. 1A-1E, 2A-2B, 3A-3B, and 4A-4E.

At 502, the method 500 includes forming one or more electrically conductive structures on a surface (e.g., the second surface A2 of FIGS. 1A and 4A) of a semiconductor die (e.g., the semiconductor die 102 of FIGS. 1A, 2A, 3A, and 4A). In some embodiments, the one or more electrically conductive structures include one or more bumps (e.g., the one or more bumps 104 of FIGS. 1A, 2A, and 3A) that are disposed to form an electrical connection or part of an electrical connection between the passive component and the semiconductor die. The one or more bumps can be formed using a bumping process such as a C4 process or stud-bumping, but is not limited to these examples.

In other embodiments, the one or more electrically conductive structures include one or more lands (e.g., the one or more lands 404 of FIG. 4A) that are disposed to form part of an electrical connection between the passive component and the semiconductor die. The one or more lands can be formed using semiconductor manufacturing processes such as metal deposition, etch, and/or lithography processes.

The one or more electrically conductive structures can be formed on the semiconductor die in wafer or singulated form. According to various embodiments, the one or more electrically conductive structures are formed on an active surface of the semiconductor die. The one or more electrically conductive structures may be configured to provide power and/or ground connections for the semiconductor die. In some embodiments, the active surface of the semiconductor die further comprises a low-k dielectric material.

At 504, the method 500 further includes attaching the semiconductor die to a substrate (e.g., the substrate 106 of FIGS. 1B, 2B, 3B, and 4B) or leadframe. In an embodiment, an inactive surface of the semiconductor die is attached to the substrate using an adhesive (e.g., the adhesive 112 of FIGS. 1B, 2B, 3B, and 4B) and an active surface of the semiconductor die is electrically coupled to the substrate using one or more bonding wires (e.g., the bonding wires 108 of FIGS. 1B, 2B, 3B, and 4B). Other semiconductor package configurations that benefit from the principles described herein can be used in other embodiments.

At 506, the method 500 further includes forming a molding compound (e.g., the molding compound 114 of FIGS. 1C, 2A, 3A, and 4C) to encapsulate the semiconductor die. The molding compound 114 can be formed according to any suitable molding compound technique, including, for example, depositing a resin in powder form into a mold and applying heat to melt/fuse the resin. Other suitable techniques can be used in other embodiments.

At 508, the method 500 further includes forming one or more openings (e.g., the one or more openings 116 of FIGS. 1C, 3A, and 4C) in the molding compound to at least partially expose the one or more electrically conductive structures through the one or more openings. The one or more openings may be formed to correspond with the one or more electrically conductive structures formed on the semiconductor die. The one or more openings can be formed using, for example, an etch or laser process to remove portions of the molding compound. According to various embodiments, the one or more electrically conductive structures provide an etch stop or laser-drilling stop material. That is, the etching process and/or the laser drilling process may readily remove material of the molding compound, but may not readily remove material of the one or more bumps or the one or more lands.

At 510, the method 500 further includes electrically coupling a passive component to the one or more electrically conductive structures through the one or more openings in the molding compound. In an embodiment, the passive component is electrically coupled to the one or more bumps by positioning the passive component onto or adjacent to the one or more bumps and heating the one or more bumps to form a direct joint (e.g., electrical connection) between the passive component and the one or more bumps. In embodiments, the passive component is disposed on the mold compound over the one or more openings, external to the molding compound and the semiconductor package, in general.

In another embodiment, the passive component is electrically coupled to the one or more bumps by depositing a solderable material onto the one or more electrically conductive structures (e.g., the one or more bumps or the one or more lands) such that the solderable material is disposed within the one or more openings, positioning the passive component onto or adjacent to the deposited solderable material, and heating the solderable material to form an electrical connection between the passive component and the one or more electrically conductive structures. In yet another embodiment, the passive component is electrically coupled to the one or more electrically conductive structures by depositing a solderable material onto the passive component, positioning the passive component over the one or more openings such that the deposited solderable material is disposed over or within the one or more openings, and heating the solderable material to form an electrical connection between the passive component and the one or more electrically conductive structures.

Suitable combinations of the techniques described in these embodiments can be used to electrically couple the passive component to the one or more electrically conductive structures. For example, the solderable material can be deposited onto the passive component and onto the one or more electrically conductive structures. Other combinations can be used in other embodiments.

At 512, the method 500 further includes routing electrical signals of the semiconductor die. In some embodiments, routing the electrical signals is performed by attaching one or more solder balls to the substrate to provide an electrical connection with an electronic device (e.g., motherboard) that is external to the substrate and the semiconductor die. The one or more solder balls may be configured to route electrical signals, such as I/O and/or power/ground signals of the semiconductor die, to or from the semiconductor package. According to various embodiments, the one or more solder balls are configured in a ball-grid array (BGA) configuration.

Other suitable configurations or package-level interconnect techniques can be used in other embodiments.

In other embodiments, routing the electrical signals is performed by forming one or more electrical connections between leads or bond fingers of a leadframe and the semiconductor die. Die singulation may be performed on the leadframe as well.

Figure 6:
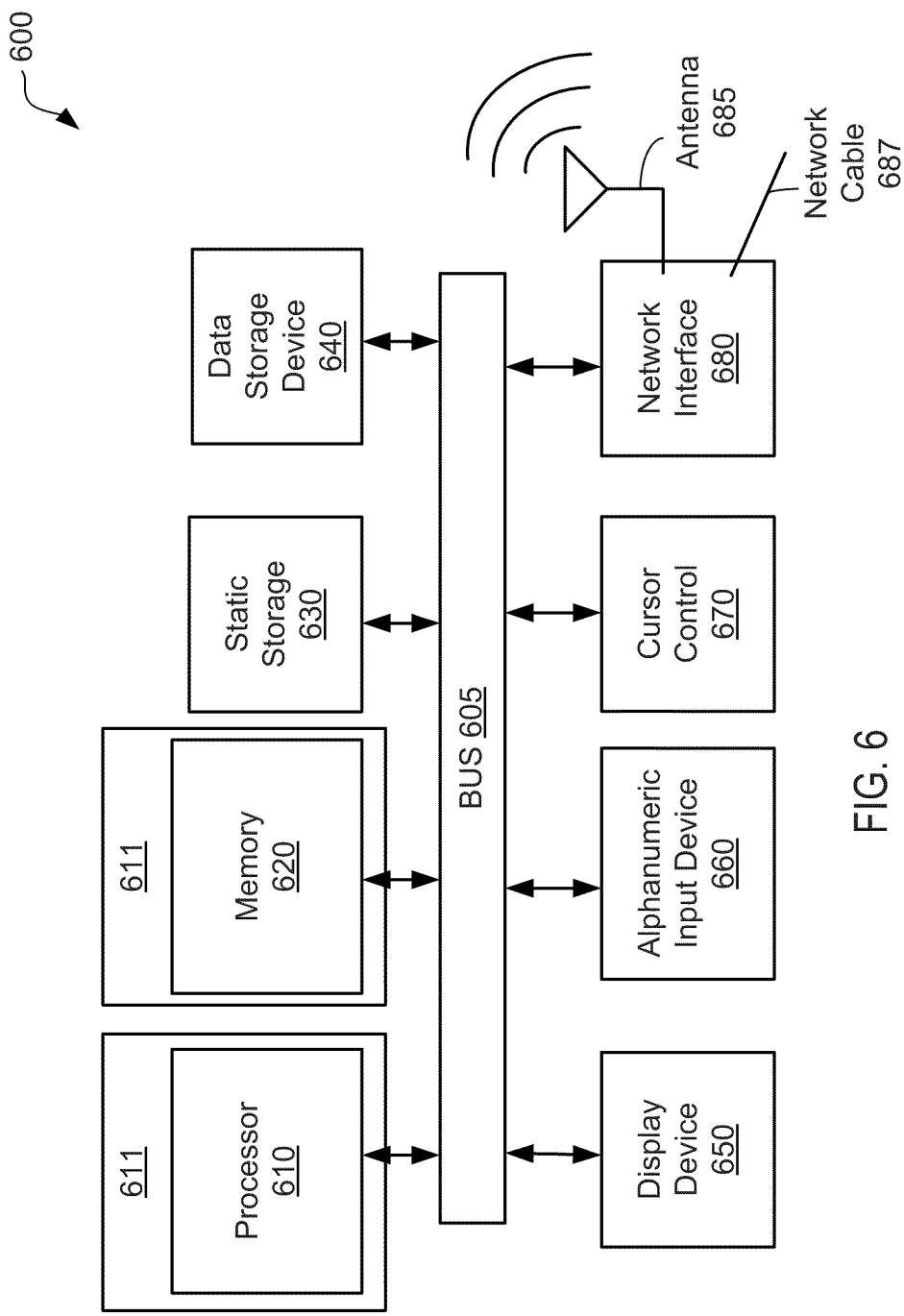
FIG. 6 schematically illustrates an electronic system configured to use a semiconductor package as described herein.

FIG. 6 schematically illustrates an electronic system 600 configured to use a semiconductor package 611 as described herein (e.g., semiconductor package 100D, 200B, 300B, 400E, of respective FIGS. 1D, 2B, 3B, and 4E). Electronic system 600 is intended to represent a range of electronic devices (either wired or wireless) including, for example, desktop computer devices, laptop computer devices, personal computers (PC), servers, printers, phones, personal digital assistants (PDA) including cellular-enabled PDAs, set top boxes, televisions, displays, pocket PCs, tablet PCs, DVD players, video players, but is not limited to these examples and can include other electronic devices. Alternative electronic systems can include more, fewer and/or different components.

The electronic system 600 includes a bus 605 or other communication device or interface to communicate information, and processor 610 coupled to the bus 605 to process information. The bus 605 can be a single system bus or a number of buses of the same or different types bridged together. The processor 610 is representative of one or more processors and/or co-processors. In one embodiment, the processor is a semiconductor die (e.g., semiconductor die 102 of FIGS. 1D, 2B, 3B, and 4E) that is configured in a semiconductor package 611 as described herein.

The electronic system 600 also includes a storage medium, which can include a variety of types of storage including memory 620, static storage 630, and data storage device 640. The storage medium is coupled to the bus 605 to store information and/or instructions that are processed and/or executed by processor 610. The storage medium can include more or less types of storage than depicted.

The electronic system 600 includes random access memory (RAM) or other storage device 620 (may be referred to as "memory"), coupled to bus 605. The memory 620 is used to store temporary variables or other intermediate information during execution of instructions by processor 610. Memory 620 includes, for example, a flash memory device. In one embodiment, memory 620 includes a semiconductor die (e.g., semiconductor die 102 of FIGS. 1D, 2B, 3B, and 4E) that is configured in a semiconductor package 611 as described herein.

The electronic system 600 can also include read only memory (ROM) and/or other static storage device 630 coupled to bus 605 to store static information and instructions for processor 610. Data storage device 640 may be coupled to bus 605 to store information and instructions. Data storage device 640 can include, for example, a magnetic disk or optical disc and corresponding drive coupled with the electronic system 600.

The electronic system 600 is coupled via bus 605 to display device 650, such as a cathode ray tube (CRT) or liquid crystal display (LCD), to display information to a user. Alphanumeric input device 660, including alphanumeric and other keys, can be coupled to bus 605 to communicate information and command selections to the processor 610. Cursor control 670 is another type of input device and includes, for example, a mouse, a trackball, or cursor direction keys to communicate information and command selections to the processor 610 and to control cursor movement on the display 650.

The electronic system 600 further includes one or more network interfaces 680 to provide access to network 620, such as a local area network, but is not limited in this regard. The network interface 680 can include, for example, a wireless network interface having antenna 685, which may represent one or more antennae. The network interface 680 can also include, for example, a wired network interface to communicate with remote devices via network cable 687, which can be, for example, an Ethernet cable, a coaxial cable, a fiber optic cable, a serial cable, or a parallel cable.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:

1. A semiconductor package comprising:
 a substrate;
 a semiconductor die coupled to the substrate, wherein the semiconductor die includes (i) a first electrically conductive structure formed on an active surface of the semiconductor die and (ii) a second electrically conductive structure formed on the active surface of the semiconductor die, and wherein the first electrically conductive structure provides (i) a power connection for the semiconductor die, or (ii) a ground connection for the semiconductor die;
 a single molding compound disposed to substantially encapsulate both the substrate and the semiconductor die, including substantially encapsulating the active surface of the semiconductor die, the molding compound having a channel formed in the molding compound, the channel (i) extending from the active surface of the semiconductor die to an opening on an exterior surface of the molding compound and (ii) at least partially including the second electrically conductive structure formed on the active surface of the semiconductor die; and
 a passive component disposed on the molding compound at least partly over the opening on the exterior surface of the molding compound, the passive component being electrically coupled to the active surface of the semiconductor die via the second electrically conductive structure through the channel in the molding compound.

2. The semiconductor package of claim 1, wherein the active surface of the semiconductor die comprises a low-k dielectric material.

3. The semiconductor package of claim 1, wherein the second electrically conductive structure comprises a bump that forms (i) an electrical connection or (ii) part of an electrical connection between the passive component and the semiconductor die.

4. The semiconductor package of claim 1, wherein the second electrically conductive structure comprises a land that forms part of an electrical connection between the passive component and the semiconductor die.

5. The semiconductor package of claim 1, wherein:
 an inactive surface of the semiconductor die is attached to the substrate using an adhesive; and
 the first electrically conductive structure includes a bonding wire that electrically couples the active surface of the semiconductor die to the substrate.

6. The semiconductor package of claim 1, wherein the second electrically conductive structure includes a material comprising solder disposed within the channel.

7. The semiconductor package of claim 1, wherein the passive component is substantially disposed external to the molding compound.

8. The semiconductor package of claim 1, wherein the passive component comprises a capacitor to supply additional current to the semiconductor die.

9. The semiconductor package of claim 1, further comprising:
   a solder ball coupled to the substrate, the solder ball to route electrical signals of the semiconductor package to and/or from an electronic device.

10. The semiconductor package of claim 1, wherein the passive component is disposed at least partly on a portion of the molding compound that substantially encapsulates the active surface of the semiconductor die.

11. The semiconductor package of claim 1, wherein the opening is a first opening, and wherein:
   the molding compound has a second opening formed on the external surface of the molding compound, and
   the passive component being electrically coupled to the active surface of the semiconductor die through both the first opening and the second opening in the molding compound.

12. The semiconductor package of claim 1, wherein an entirety of the molding compound is formed prior to the passive component being attached to the semiconductor die.

\* \* \* \* \*